(12) United States Patent
Banaska et al.

(10) Patent No.: US 7,202,676 B2
(45) Date of Patent: Apr. 10, 2007

(54) SOURCE MEASURE CIRCUIT

(75) Inventors: John G. Banaska, Wadsworth, OH (US); Wayne C. Goeke, Hudson, OH (US); Gregory Sobolewski, Seven Hills, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 0 days.

(21) Appl. No.: 11/068,120

(22) Filed: Feb. 28, 2005

(65) Prior Publication Data

US 2006/0192571 A1  Aug. 31, 2006

(51) Int. Cl.
*G01R 27/08* (2006.01)

(52) U.S. Cl. .............. 324/713; 324/691; 324/609

(58) Field of Classification Search ............... 324/713, 324/691, 609
See application file for complete search history.

(56) References Cited

U.S. PATENT DOCUMENTS

| | | | | |
|---|---|---|---|---|
| 3,624,418 A | * | 11/1971 | Kohl et al. | 327/110 |
| 4,535,303 A | * | 8/1985 | Schoofs et al. | 330/297 |
| 4,795,962 A | * | 1/1989 | Yanagawa et al. | 324/611 |
| 6,262,670 B1 | * | 7/2001 | Ballou | 340/664 |
| 6,911,831 B2 | * | 6/2005 | Tsutsui | 324/713 |

* cited by examiner

*Primary Examiner*—Andrew H. Hirshfeld
*Assistant Examiner*—John Zhu
(74) *Attorney, Agent, or Firm*—Pearne & Gordon LLP

(57) ABSTRACT

A circuit for alternatively controlling a current through a device and permitting measurement of a voltage across the device or controlling a voltage across the device and permitting measurement of a current through the device includes a sense impedance in series combination with the device, an error amplifier selectable to control the controlled current or voltage, the error amplifier providing an error signal for the control, and a floating buffer driving the series combination in response to the error signal.

4 Claims, 3 Drawing Sheets

SOURCE MEASURE CIRCUIT

BACKGROUND OF THE INVENTION

The present invention relates to electrical measurements and, in particular, to source measure units.

The use of source measure units (SMUs) has become common in many fields, particularly in the testing of semiconductors, integrated circuits and electronic devices.

Referring to FIG. 1, a basic prior art SMU circuit 10 is illustrated. In understanding these circuits it is important to note that the op-amps will do everything in their power to force the difference between their inputs to zero. If S1 is closed, a voltage corresponding to $V_{DAC}$ will be forced across $R_{LOAD}$. If S2 is closed, a current corresponding to $I_{DAC}$ will be forced through $R_{LOAD}$ (i.e., $V_{RSENSE}/R_{SENSE}$ is the current through $R_{SENSE}$ and hence through $R_{LOAD}$). The unforced parameter, current or voltage with respect to $R_{LOAD}$, can then be measured with unshown measuring equipment.

The current sense resistor is directly in series with the output. Any instantaneous load change will result in a transient across $R_{SENSE}$ (and thus $V_{OUT}$). Likewise, any instantaneous change in $R_{SENSE}$ (for example, because of a measurement range change) will also result in a glitch on the output. This necessitates "slow switching" of the range elements, adding many components and complicating the range change algorithm, leading to long range change times. $R_{SENSE}$ will also directly interact with capacitive loads forming a pole at $1/(2\Pi R_{SENSE} C_{LOAD})$. This requires a compensating capacitor across $R_{SENSE}$, resulting in a settling time of the current sense element when measuring current, and an overshoot of current when sourcing current. A final nuance is that the voltage sense sits on top of the current sensing resistor. Thus $R_{SENSE}*I_{OUT}$ is a common mode term that invariably ends up on the specification sheet as an error in $V_{SOURCE}$ and $V_{MEASURE}$.

SUMMARY OF THE INVENTION

A circuit for alternatively controlling a current through a device and permitting measurement of a voltage across the device or controlling a voltage across the device and permitting measurement of a current through the device includes a sense impedance in series combination with the device, an error amplifier selectable to control the controlled current or voltage, the error amplifier providing an error signal for the control, and a floating buffer driving the series combination in response to the error signal.

DESCRIPTION OF THE PREFERRED EMBODIMENTS

Figure 1:
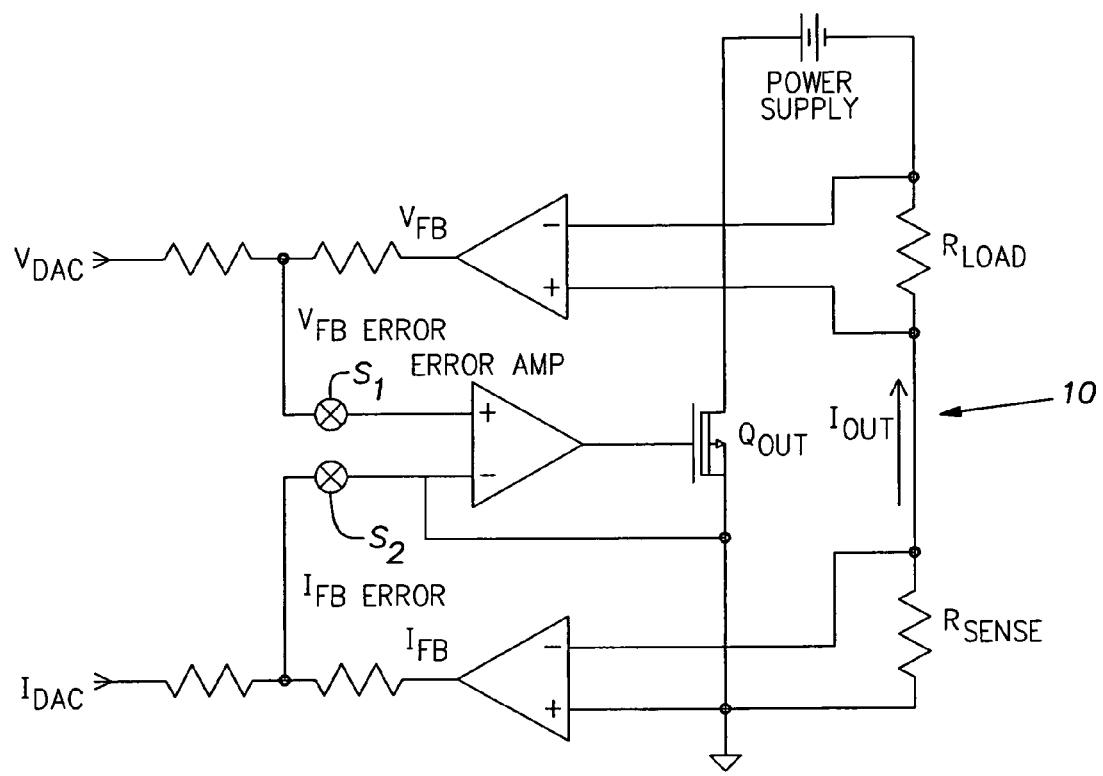
FIG. 1 is a schematic diagram of a prior art SMU circuit.
Figure 2:
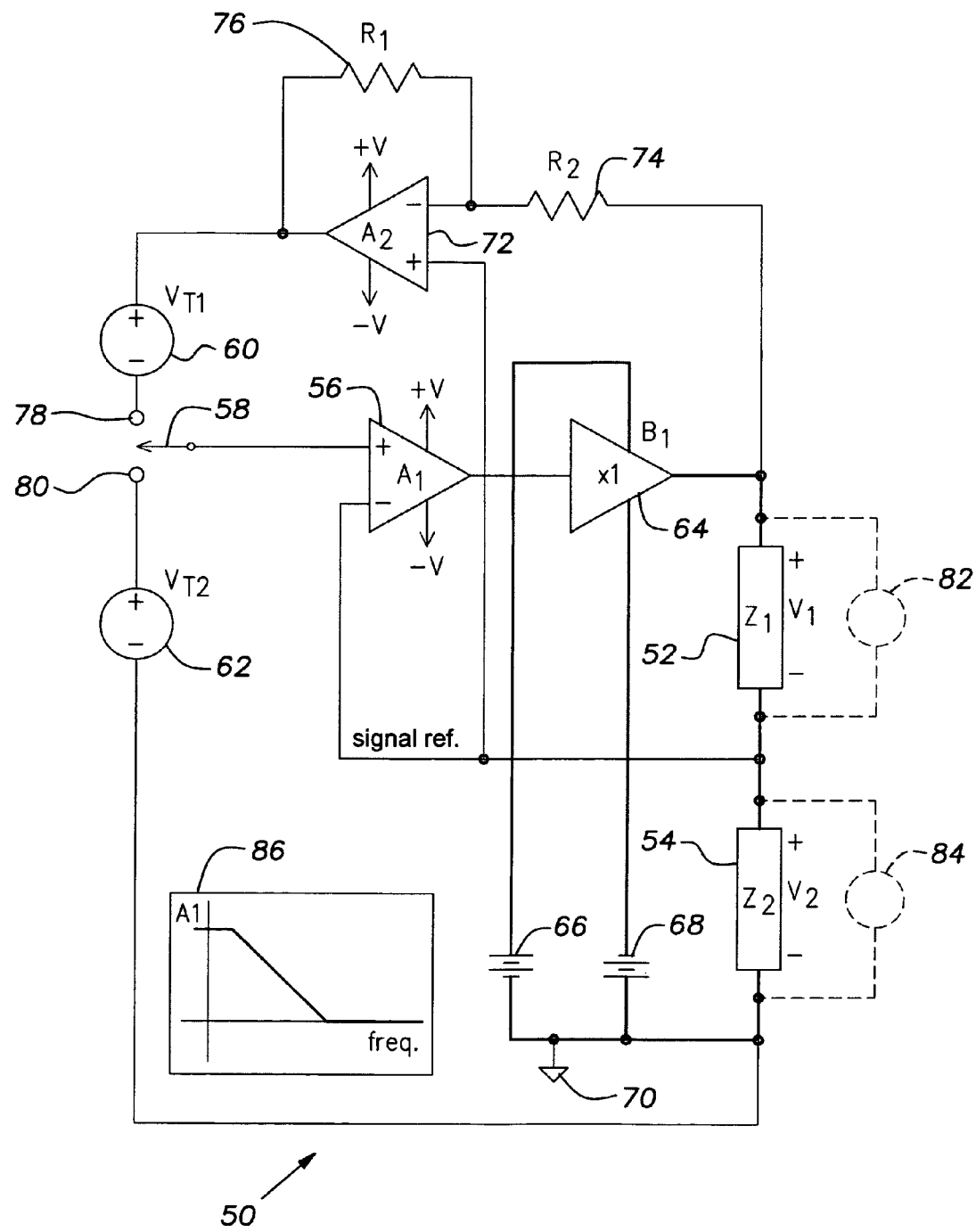
FIG. 2 is a schematic diagram of a circuit according to the invention.

Referring to FIG. 2, an improved circuit 50 for alternatively controlling a current through a device 52 (indicated as an impedance) and permitting measurement of a voltage across the device 52 or controlling a voltage across the device 52 and permitting measurement of a current through the device 52 suitable for use, for example, in an SMU, parametric analyzer or power supply is illustrated.

The circuit 50 includes a sense impedance 54 in series with the device 52, an error amplifier 56, a function switch 58, and voltage sources 60, 62.

Also included is a floating buffer 64 with power supplies 66, 68 floating on the reference 70. This results in the buffer 64 moving its operating point in response to its own output.

An op-amp 72, with resistors 74, 76 provides a signal corresponding to an inverted form of the voltage across the device 52.

The amplifier 56 provides an error signal to the buffer 64 which drives the device 52 and impedance 54. The switch 58 selects whether the error amplifier 56 is connected to the voltage control loop terminal 78 or the current control loop terminal 80.

Measuring equipment 82, 84 may be provided to measure the voltage/current signals associated with the device 52 and impedance 54.

When the switch 58 is connected to the terminal 78, the voltage across the device 52 is forced to correspond to the voltage 60. When the switch 58 is connected to the terminal 80, the current through the device 52 is forced to correspond to the current through the impedance 54 which is forced by the voltage across the impedance 54 corresponding to the voltage 62.

It is desirable that the amplifier 56 have a gain at low frequencies (i.e., a frequency below the bandwidth of the buffer 64) and simply follow the positive input at high frequencies (i.e., unity gain from below the bandwidth of the buffer 64 and holding to above the bandwidth of the buffer 64). For example, the characteristic could be actual gain below 1 MHz and unity gain from 1 MHz out to 20 MHz if the buffer 64 has 5–10 MHz of bandwidth. An exemplary Bode plot 86 is included in FIG. 2.

In the controlled voltage mode (the switch 58 in position 78), the circuit 50 masks the effects of the impedance 54. This reduces the deleterious effects on measurement accuracy of rapid changes in the load presented by the device 52. It also masks the effects of changed values in the impedance 54, itself (e.g., range-changing). This permits faster, simpler range-changing. Closely related, smaller compensating capacitors with resulting faster settling times may be used. Accuracy in general is improved with a masked impedance 54.

At the same time, the circuit 50 avoids creating deleterious effects on the controlled current mode (switch 58 in position 80). Basically, the impedance 54 appears unchanged in this mode (relative to the prior art), where a reduced impedance would result in its own problems.

Figure 3:
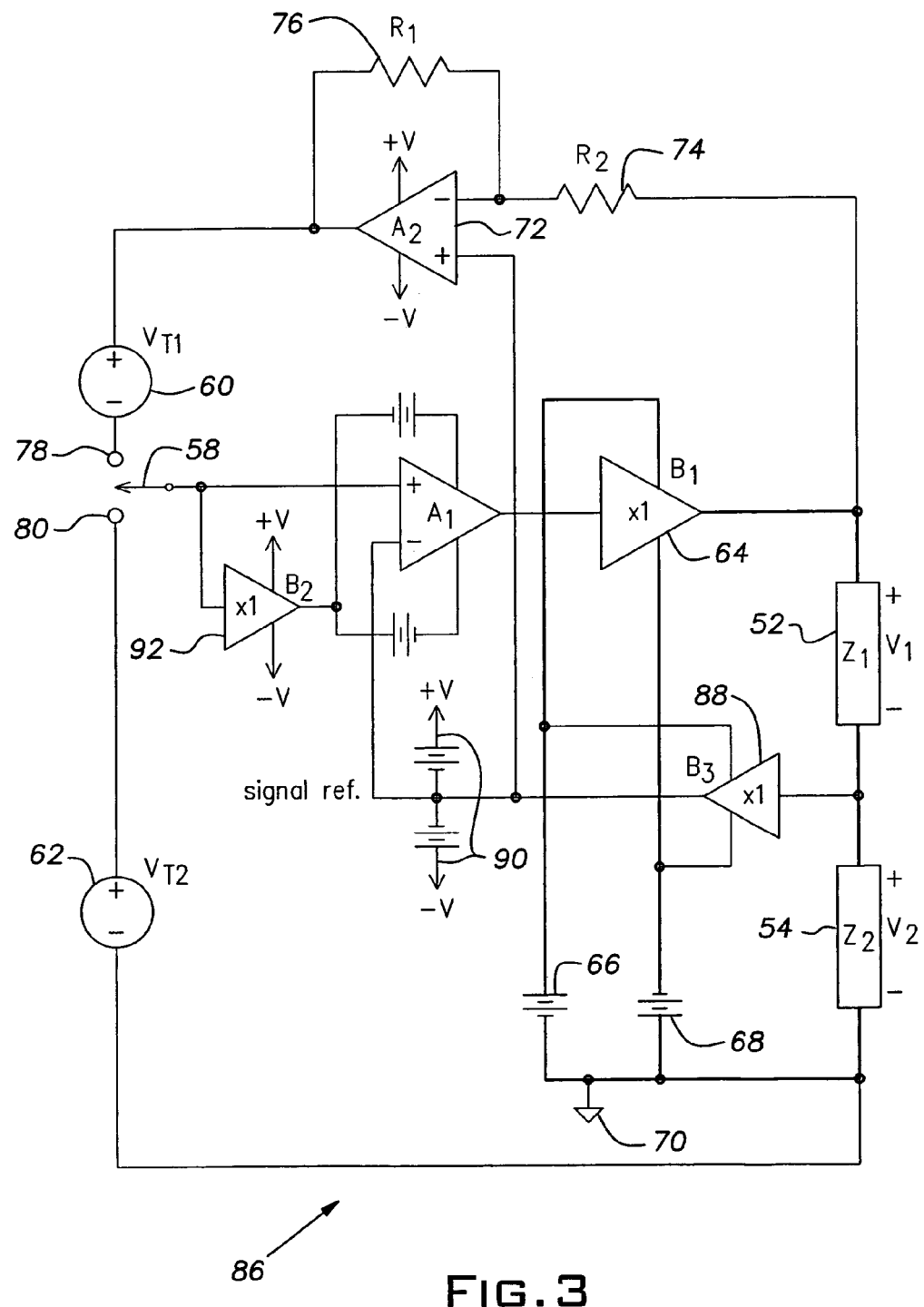
FIG. 3 is a schematic diagram of an additional circuit according to the invention.

Referring to FIG. 3, a circuit 86 further refines the circuit 50. A floating buffer 88 is added to help ensure that the current through the load 52 and the impedance 54 are equal (i.e., limit leakage). Also a floating power supply 90 is added to reduce common mode signals seen by the amplifier 56 that the op-amp 72 must reject. In addition, the buffer 92 is added to float the power supply of the amplifier 56. This improves the ability of the amplifier 56 to act as a follower at high frequencies.

It should be noted that because of the duality of current and voltage, the choice of description as to current or voltage is largely a matter of convenience and practice, the foregoing is therefore basically equally applicable to either.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A circuit for alternatively controlling a current through a device and permitting measurement of a voltage across the device or controlling a voltage across the device and permitting measurement of a current through the device, said circuit comprising:
   a sense impedance in series combination with said device;
   an error amplifier selectable to control said controlled current or voltage, said error amplifier providing an error signal for said control; and
   a floating buffer driving said series combination in response to said error signal, said floating buffer having an output and a power supply for said floating buffer floating on a reference established in response to said output, wherein said floating buffer operates about an operating point that moves with said output.

2. A circuit according to claim 1, further comprising an inverting circuit providing a voltage control signal to said error amplifier for said voltage control, said voltage control signal being in inverted relationship with said voltage across said device.

3. A circuit according to claim 1, further comprising a circuit providing a current control signal to said error amplifier for said current control, said current control signal corresponding to said current through said device.

4. A circuit according to claim 1, further comprising signal amplitude measuring equipment for measuring said current through said device or said voltage across said device.

* * * * *